Figure 1:
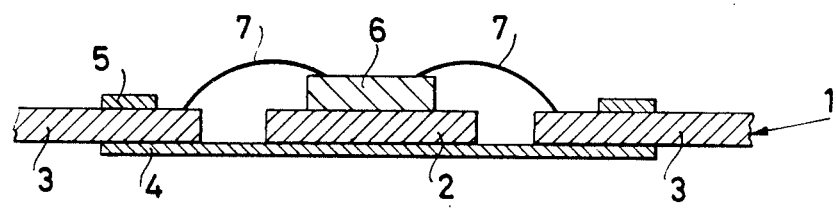

United States Patent [19]

Fusaroli et al.

[11] Patent Number: 4,971,930
[45] Date of Patent: Nov. 20, 1990

[54] EPROM SEMICONDUCTOR DEVICE ERASABLE WITH ULTRAVIOLET RAYS AND MANUFACTURING PROCESS THEREOF

[75] Inventors: Marzio Fusaroli, Milan; Laura Ceriati, Sesto S. Giovanni, both of Italy

[73] Assignee: SGS Microelectronics S.p.A., Italy

[21] Appl. No.: 224,202

[22] Filed: Jul. 21, 1988

Related U.S. Application Data

[62] Division of Ser. No. 939,098, Dec. 8, 1986, abandoned.

[30] Foreign Application Priority Data

Dec. 20, 1985 [IT] Italy .............. 23335 A/85

[51] Int. Cl.⁵ ............................................. H01L 21/56
[52] U.S. Cl. ................................................... 437/217
[58] Field of Search .................. 437/209, 217; 357/30, 357/72, 74

[56] References Cited

U.S. PATENT DOCUMENTS

| 3,622,419 | 11/1971 | London ........................... 437/209 |
| 4,460,915 | 7/1984 | Engel .................................. 357/74 |
| 4,491,857 | 1/1985 | McElroy ............................ 357/53 |
| 4,644,384 | 2/1987 | Charoensakvirochana ........... 357/74 |
| 4,663,833 | 5/1987 | Tanaka et al. ..................... 357/72 |
| 4,665,426 | 5/1987 | Allen et al. ........................ 357/54 |
| 4,697,203 | 9/1987 | Sakai et al. ........................ 357/72 |
| 4,707,725 | 11/1987 | Ito ..................................... 357/72 |

FOREIGN PATENT DOCUMENTS 0076867 5/1982 Japan .
0034934 3/1983 Japan .

*Primary Examiner*—Olik Chaudhuri
*Assistant Examiner*—Andrew Griffis
*Attorney, Agent, or Firm*—Sixbey, Friedman, Leedom & Ferguson

[57] ABSTRACT

An EPROM device erasable with ultraviolet rays is made with a container of plastic material opaque to ultraviolet rays having a window overlying the semiconductor chip. Plastic material transparent to ultraviolet rays fills the interior space of the container over said chip. The container is formed by moulding of the mass of transparent plastic material previously formed on the semiconductor chip, or a container formed preliminarily is filled with a semiconductor chip and then with a mass of transparent plastic material and finally closed with a transparent lens which fixes the thickness of the transparent mass, distributing it uniformly in the interior space of the container.

2 Claims, 4 Drawing Sheets

EPROM SEMICONDUCTOR DEVICE ERASABLE WITH ULTRAVIOLET RAYS AND MANUFACTURING PROCESS THEREOF

This application is a divisional of Ser. No. 939,098, filed 12/8/86, now abandoned.

The present invention relates to an EPROM semiconductor device erasable with ultraviolet rays and the manufacturing process thereof.

Devices of this type are known to require an outer container or package having a part transparent to ultraviolet rays to permit said rays to reach the semiconductor chip placed inside said container.

A solution known at present calls for the use of a ceramic container fitted with a quartz or sapphire lens. This is a costly and hence unsatisfactory solution.

The object of the present invention is to produce a semiconductor device of the EPROM type erasable with ultraviolet rays which would be economical to produce.

In accordance with the invention said object is achieved by means of a semiconductor device cf the EPROM type erasable with ultraviolet rays comprising a semiconductor chip placed inside a container characterized in that said container consists of a hollow body of plastic material opaque to ultraviolet rays having a window overlying said semiconductor chip and in that the interior space of the container is filled with plastic material transparent to ultraviolet rays.

Proper choice of the thickness of the transparent plastic material placed between the chip and the window of the container permits obtaining a fully functional and at the same time much more economical device.

Figure 2:
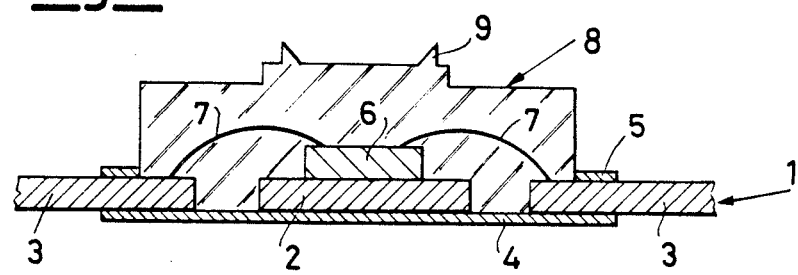
Figure 3:
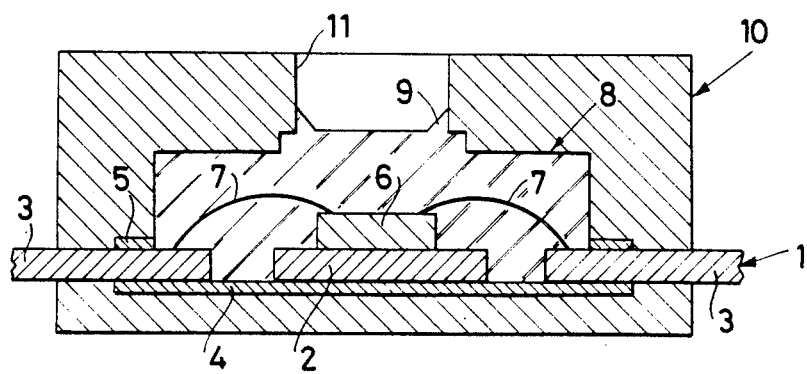
Figure 9:
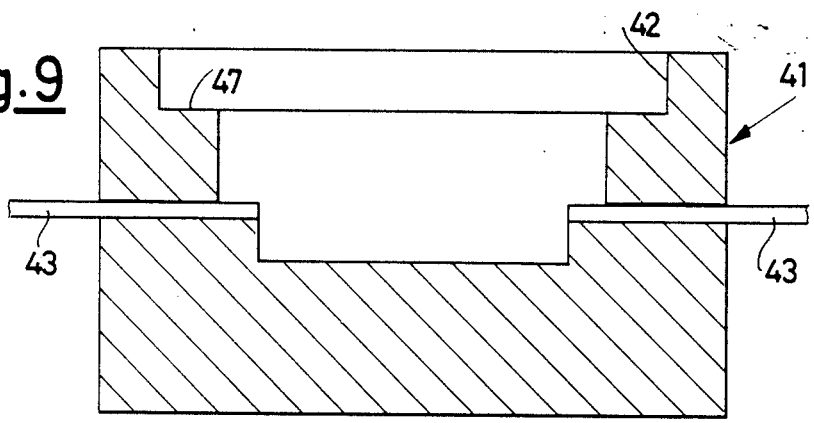
Figure 10:
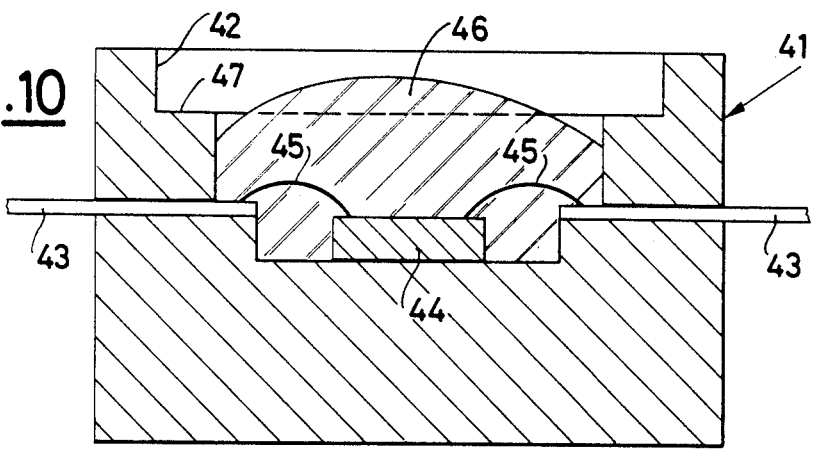
Figure 11:
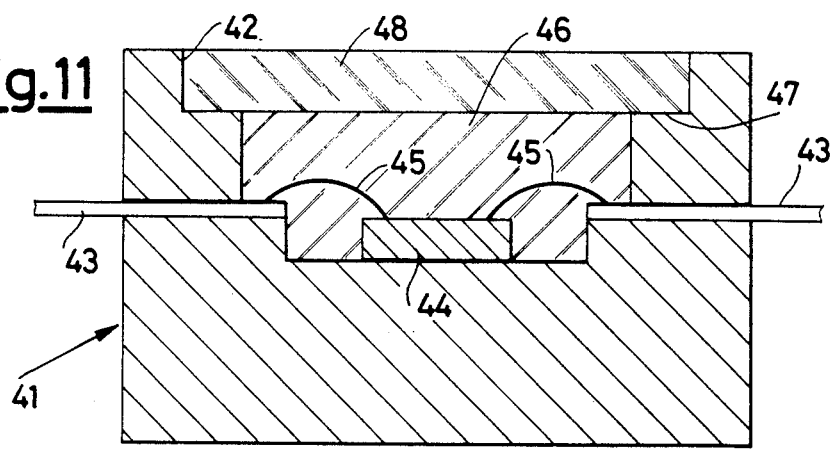

Some examples of processes usable alternatively for fabrication of the device in accordance with the invention are illustrated as nonlimiting examples in the annexed drawings wherein:

FIGS. 1-3 show cross sections of a device in accordance with the invention in various stages of a first fabrication process, FIGS. 4-8 show top and sectional views of a device in accordance with the invention in various stages of a second fabrication process, and FIGS. 9-11 show sectional views of a device in accordance with the invention in various stages of a third fabrication process.

The process illustrated in FIGS. 1-3 calls for the use of an ordinary metal frame 1 with a central pad 2 and side leads 3. Under the frame 1 is preliminarily disposed a layer of insulating material 4 and thereon is preliminarily disposed a frame of insulating material 5. On the pad 2 is then attached a semiconductor chip 6 electrically connected to the side leads 3 by thin electrical wires or bonds 7. This situation is illustrated in FIG. 1.

Using an appropriate mould with an internal cavity having horizontal dimensions equal to the area described inside the insulating frame 5 and utilizing the layers 4 and 5 as sealing barriers, there is formed on the semiconductor chip on the bonds 7 and on the underlying parts of the frame 1 a mass of resin having a chemical composition and/or thickness such that it is transparent to ultraviolet rays. The transparent mass 8 has an upper annular projection 9 centred on the semiconductor chip 6 the purposes of which is described below. This situation is illustrated in FIG. 2.

Using another mould having a cavity of appropriate shape there is formed around the above assembly a container 10 of resin opaque to ultraviolet rays which has a window 11 centred on the upper projection 9 of the transparent mass 8 and hence on the semiconductor chip 6. In this stage the projection 9 prevents the opaque resin from reaching the transparent resin part underlying the window 11. Thus there is obtained the finished device of FIG. 3.

Figure 4:
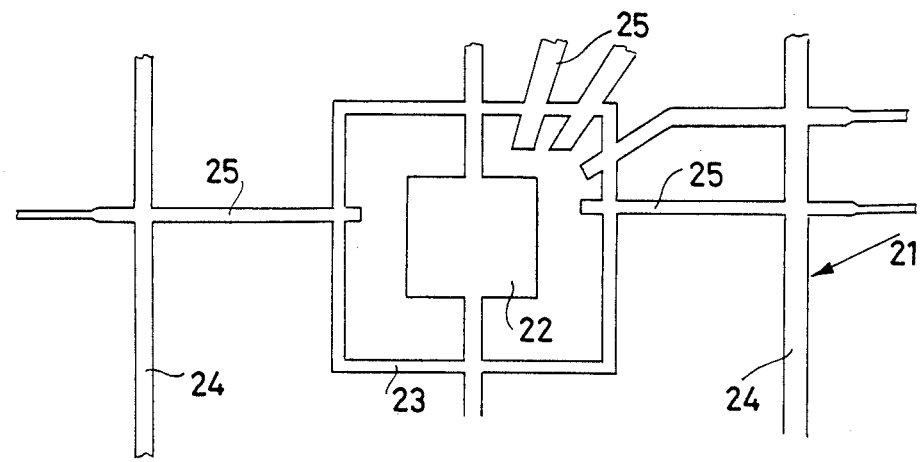
Figure 5:
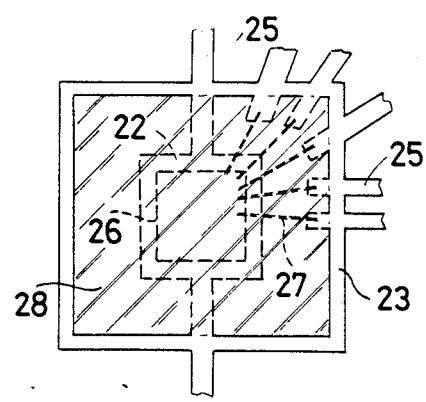
Figure 6:
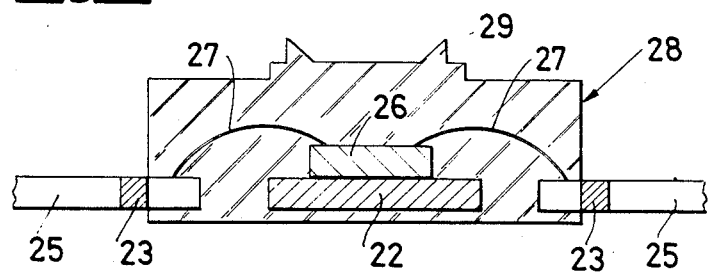
Figure 7:
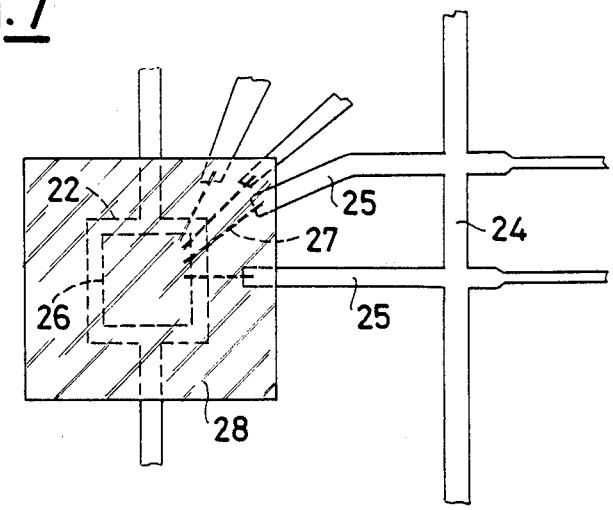
Figure 8:
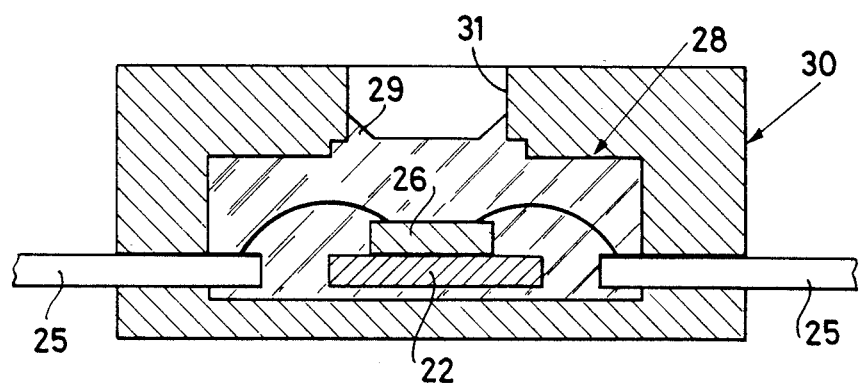

The process illustrated in FIGS. 4-8 calls for the use of a metal frame 21 including a central pad 22, an internal frame 23, an external frame 24 and leads 25 (FIG. 4). On the pad 22 there is applied a semiconductor chip 26, which is then connected to the leads 25 by bonds 27. With an appropriate mould and using the internal frame 23 as a gasket there is formed on the chip 26 and on the bonds 27 a resin mass 28 of a thickness such that it is transparent to ultraviolet rays. The mass 28 has an upper central projection 29 centred on the chip 26 (FIGS. 5 and 6). The internal frame 23 (FIG. 7) is eliminated by cutting and finally an external container of opaque resin 30 is produced which has a window 31 centred on the upper projection 29 of the transparent mass 28 and hence on the semiconductor chip 26. There is thus obtained the device of FIG. 8.

The process illustrated in FIGS. 9-11 differs substantially from the preceding ones by the fact that it uses a container of opaque plastic material 41 in the form of a hollow body with a central window 42 preliminarily formed on an assembly of leads 43 (FIG. 9). Inside the container 41 there is then inserted a semiconductor chip 44 connected to the leads 43 by means of bonds 45, and on the chip and bond assembly is poured a mass of transparent resin 46 (FIG. 10). In the window 42, utilizing the striking engagement with a shoulder 47, there is inserted a transparent lens 48 which compresses the mass of transparent resin 46, fixing the thickness thereof and distributing it uniformly in such a manner as to occupy all the interior space of the container 41 (FIG. 11). This permits proper protection of the semiconductor chip 44 together with description of a thickness of transparent resin suitable for transmission of ultraviolet rays.

We claim:

1. Process for fabrication of an EPROM semiconductor device erasable with ultraviolet rays including a semiconductor chip placed inside of a container characterized in that said container consists of a hollow body of plastic material opaque to ultraviolet rays having a window overlying said semiconductor chip and in that the interior space of the container is filled with plastic material transparent to ultraviolet rays, said process comprising the prearrangement of a metal frame formed of a central pad and side leads, the application of an insulating frame and an insulating layer over and under said frame respectively, application of a semiconductor chip over said pad and electrical connection thereof to said leads, formation of a mass of transparent plastic material over said chip and the electrical connection thereof to said leads inside said insulating frame, and formation of a container of opaque plastic material around said mass, said chip and said frame with an open window formed in said container over said mass and said chip, wherein the process further comprises forming an upper projection on said mass of transparent plastic material and using said upper projection for the purposes of forming a barrier preventing the opaque plastic material from extending over the chip and centering the container during subsequent formation thereof.

2. Process for the fabrication of an EPROM semiconductor device erasable with ultraviolet rays including a semiconductor chip placed inside of a container characterized in that said container consists of a hollow body of plastic material opaque to ultraviolet rays having a window overlying said semiconductor chip and in that the interior space of the container is filled with plastic material transparent to ultraviolet rays, said process comprising prearrangement of a metal frame formed of a central pad, side leads, an internal frame and an external frame, application of a semiconductor chip over said pad and electrical connection thereof to said leads, formation of a mass of transparent plastic material over said chip and the electrical connection thereof to said leads inside said internal frame, and formation of a container of opaque plastic material around said mass, said chip and said frame with an open window formed in said container over said mass and said chip wherein the process further comprises forming an upper projection on said mass of transparent plastic material and using said upper projection for the purposes of forming a barrier preventing the opaque plastic material from extending over the chip and centering the container during subsequent formation thereof.

* * * * *

UNITED STATES PATENT AND TRADEMARK OFFICE
CERTIFICATE OF CORRECTION

PATENT NO.  : 4,971,930
DATED       : November 20, 1990
INVENTOR(S) : Marzio Fusaroli et al It is certified that error appears in the above-identified patent and that said Letters Patent is hereby corrected as shown below:

On the title page, the Assignee should read as follows:

--[73] Assignee:   SGS MICROELETTRONICA S.p.A.
                   Catania, Italy --.

Signed and Sealed this

Eighth Day of December, 1992

Attest:

DOUGLAS B. COMER

*Attesting Officer*      *Acting Commissioner of Patents and Trademarks*